United States Patent [19]

Motika et al.

[11] Patent Number: 5,640,402
[45] Date of Patent: Jun. 17, 1997

[54] FAST FLUSH LOAD OF LSSD SRL CHAINS

[75] Inventors: Franco Motika; Donato Orazio Forlenza; Adrian Charles Anderson, all of Dutchess County, N.Y.

[73] Assignee: International Business Machines Corporation, Armonk, N.Y.

[21] Appl. No.: 569,389

[22] Filed: Dec. 8, 1995

[51] Int. Cl.[6] ................................................. G01R 31/28
[52] U.S. Cl. ..................... 371/22.3; 371/22.1; 371/25.1
[58] Field of Search .......................... 371/22.3, 22.1, 371/22.5, 25, 27; 327/202; 307/271.1

[56] References Cited

U.S. PATENT DOCUMENTS

| | | |
|---|---|---|
| 4,071,902 | 1/1978 | Eichelberger et al. . |
| 4,428,060 | 1/1984 | Blum . |
| 4,441,075 | 4/1984 | McMahon . |
| 4,580,137 | 4/1986 | Fiedler et al. . |
| 4,630,270 | 12/1986 | Petit et al. . |
| 4,698,830 | 10/1987 | Barzilai et al. . |
| 4,972,414 | 11/1990 | Borkenhagen et al. . |
| 5,018,144 | 5/1991 | Corr et al. . |
| 5,150,366 | 9/1992 | Bardell et al. ............ 371/22.3 |
| 5,173,906 | 12/1992 | Dreibelbis et al. . |
| 5,206,861 | 4/1993 | Hannon et al. . |
| 5,280,616 | 1/1994 | Butler et al. . |
| 5,331,643 | 7/1994 | Smith ......................... 371/22.3 |
| 5,386,392 | 1/1995 | Cantiant et al. . |
| 5,463,338 | 10/1995 | Yurash ......................... 327/202 |
| 5,502,731 | 3/1996 | Meltzer ....................... 371/22.3 |
| 5,519,713 | 5/1996 | Baeg et al. ................... 371/22.1 |

*Primary Examiner*—Robert W. Beausoliel, Jr.
*Assistant Examiner*—Nadeem Iqbal
*Attorney, Agent, or Firm*—Whitham, Curtis, Whitham & McGinn; Charles W. Peterson, Jr.

[57] ABSTRACT

A method of effectively reducing a length of shift register (SR) latches used in scan design testing for testing macro structures embedded within very large logic structures eliminates tester hardware buffer limitations required to load and unload a long chain SR. A plurality of shift register latches are connectable in a chain for scan design testing. Each shift register latch is composed of an L1 and an L2 latch receiving A and B clocks, respectively, to shift data into and out of the shift register latch. First specific shift register latches in a chain of shift register latches are used to generate test data inputs to an embedded macro structure, second specific shift register latches in the chain of shift register latches are used to receive test data outputs from the embedded macro structure. A separate B' clock is applied to the L2 latches of the first and second specific shift register latches while maintaining the B clock for the L2 latches for other shift register latches in the chain. The B' clock is similar to the B clock but displaced in time. The chain of shift register latches is flushed prior to a load operation of data for testing the embedded macro structure by simultaneously pulsing the A and B clocks. Then the embedded macro structure is loaded from the L2 latches of the first specific shift register latches with the L1 latches of the second specific shift register latches being loaded from the embedded macro structure by pulsing the B' clock to produce a scan cycle for the embedded macro structure.

7 Claims, 1 Drawing Sheet

FAST FLUSH LOAD OF LSSD SRL CHAINS

BACKGROUND OF THE INVENTION

1. Field of the Invention

The present invention generally relates to logic and memory array circuits implemented in integrated circuits with built-in self-testing for logic and memory fault detection and, more particularly, to a method of effectively reducing the length of the shift register (SR) latches for long level-sensitive scan design (LSSD) and generalized scan design (GSD) shift register chains to a relatively small number of latches.

2. Background Description

The level-sensitive scan design (LSSD) and generalized scan design (GSD) test techniques (or simply scan design test techniques) enable testing at all levels of very large scale integrated (VLSI) circuit packaging. The principles of the LSSD technique are described, for example, in U.S. Pat. No. 3,783,254, No. 3,784,907 and No. 3,961,252, all to Eichelberger and assigned to the assignee of this application. The circuit implemented on a chip typically comprises several combinatorial logic blocks, each of which is associated with a storage cell consisting of a latch called a shift register latch (SRL). A single long shift register (SR), termed an LSSD chain, is formed by chaining a number of such cells or SRLs together. Each SRL, which is actually a pair of bistable latches designated L1 and L2, forms a single stage of the shift register.

The L1 latch can be set from two sources by two different clock signals, A and C, applied to clock inputs A and C, with the latter input receiving system clock signals. Latch L1 also has a data input (DI) and a test input called scan data in (SDI). Test patterns consisting of binary bit vectors are applied to the SDI pin of the chip. Latch L2 has a data input connected to one of the outputs of the associated L1 latch and an input that receives B clock signals causing the output data from L1 to be transferred into L2.

The long shift register (SR) referred to above is formed by connecting the output of the L2 latch in the first SRL (forming the first stage of the shift register) to the input of the L1 latch in the next SRL, and so on, down to the last SRL. The test input SDI of the L1 latch in the fist SRL is connected to the SDI pin of the chip, and the output of the L2 latch in the last SRL is connected to an output pin, designated the scan data out (SDO), of the chip. The A, B and C clocks of the SRL are connected to the chip pins so designated. Bits are transferred through the SRL in two steps. A bit applied to the test input SDI of latch L1 is loaded therein by the A clock pulse, and the same bit is obtained at the output of the L2 latch at the occurrence of the B clock pulse. A number of pairs of A and B clock pulses equivalent to the number of SRLs is required in order for a signal applied to the SDI input of a functional element to be transferred to the SDO output thereof. In this mode of operation, clock c is not pulsed.

To test a functional element, a static test called a "flush" test is first performed. To this end, an active potential, for example a high logic level, is applied to the A and B clock inputs (A=B=1) while the C clock input receives a low logic level (C=0). A square pulse is applied to the SDI input of the chain to be tested and is retrieved at the SDO output after a predetermined time interval has elapsed. A typical SR chain may consist of numerous inversion steps. As a result, the data pulse applied to input SDI is obtained at output SDO of the chain after a time interval equal to the accumulated response times of all the SRLs in the chain has elapsed. In addition to providing useful information on the propagation times, the flush test determines whether the LSSD chain is functioning properly.

A dynamic test called a "scan" test is next performed. In this test, the C clock is maintained at a low logic level while pulsing the A and B clocks. The LSSD chain then acts as a shift register. This test serves to establish that the chain is not operating properly if the data pulse applied to the SDI input fails to be transferred to the SDO output when an appropriate number of clock pulses are applied to the A and B clock inputs.

A functional test is then performed in the scan mode. In this test, a test pattern (a series of binary data) is applied to the SDI input and the A and B clocks are pulsed to transfer the test pattern into the SRLs. All the latches in the functional element having thus been initialized, logic data are present on the parallel output pins of the chip. By applying stimuli to the parallel input pins of the chip and pulsing the C clock, a binary vector reflecting some particular state of the combinatorial logic is loaded in the LSSD chain. The output pins and SRL states are then observed to determine if the combinatorial logic is functioning properly as compared to the expected states determined by a computer simulation model.

Typically, one or more array macros are embedded in circuit with most or all of the address and data-in signals provided by SRLs and data-out signals terminating at SRLs. As used herein, a macro is a standard circuit in a circuit library available to the circuit designer. Such standard circuits are replicated many times in the complete circuit implemented in the chip. To properly test these embedded array (EA) macro structures, one usually applies a large number of algorithmic pattern sequences. These patterns are designed to detect faults associated with the whole address space and various operation modes of the macro structure.

The basis for logic built-in self-test (LBIST) and array built-in self-test (ABIST) methodology is to generate product test vectors in order to detect potential faults in the product while the output responses are measured at primary outputs (POs) or captured into a multiple input shift register (MISR). In the diagnostic mode, the strategy is to scan out and observe each response that will be captured into the MISR signature, rather than one scan out of the MISR signature at the end-of-test. The long scan chains will increase test times significantly.

The problem described is surfacing as a major concern in testing. The extensive use of EA macro structures in large LSSD structures and the rapid growth of both the logic and EA densities have pushed existing test systems beyond their capabilities and made test times unacceptable. The problem increases in severity as the number of latches in the SRL extends (in the thousands) to the point where most of the EA test time is consumed in loading and unloading the SRLs rather than testing the array. In addition to the test time problem, most state of the art high speed test systems have limited buffer space and limited algorithmic looping range control to meet the requirements of current product designs.

Several approaches have been considered to solve these problems. One proposed approach is to reconfigure the SRLs such that the latches associated with the EA inputs are placed at the beginning of the SR string, while the latches associated with the EA outputs are placed at the end of the SR string. Then, during the EA test, only a partial shift register load operation is performed. The drawbacks to this approach are that reconfiguring these latches impacts system performance and restricts wiring flexibility. The SR reconfiguration is further restricted when the EA uses the same SR for input and output latching.

Another proposed solution consists of separating the EA specific SRLs into a separate and independent shift register string. The drawback of this approach is that it requires addition inputs and outputs (I/Os) for the shift register input (SRI) and the shift register output (SRO) for each addition shift register string. Yet another proposed solution consists of reconfiguring the SR chain to logically bypass the non-EA SRLs. This approach also requires an additional input to control the scan mode during the EA test and supporting logic to de-gate or bypass the undesired SRLs.

SUMMARY OF THE INVENTION

It is therefore an object of the present invention to provide a method of accessing an embedded array macro with inputs and outputs corresponding to shift register latches (SRLs) of one or more long level-sensitive scan design (LSSD) shift register chains in a way that eliminates hardware buffer limitations required to load the long chain of SRLs.

The problem solved by this invention is that of accessing an EA macro structure with inputs and outputs corresponding to shift register latches (SRLs) of a long LSSD shift register chain. First, the invention eliminates tester hardware buffer limitations required to load the long chain of SRLs while mixing in the algorithmically generated array patterns. Second, the invention reduces test time required for loading these long SR strings and the associated data volumes. The EA macro structure is accessed with inputs and outputs corresponding to SRLs of a long LSSD shift register chain.

According to the invention, there is provided a simple modification to the LSSD loading sequence by assigning a separate B' clock to the SRLs associated with each EA macro structure. The basic idea is that only a small subset of the SRLs is required during EA testing. The original B clock is maintained for the rest of the SRLs, thus allowing mixing of EA test patterns within large LSSD logic structures with minimum effect on the normal testing sequence.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
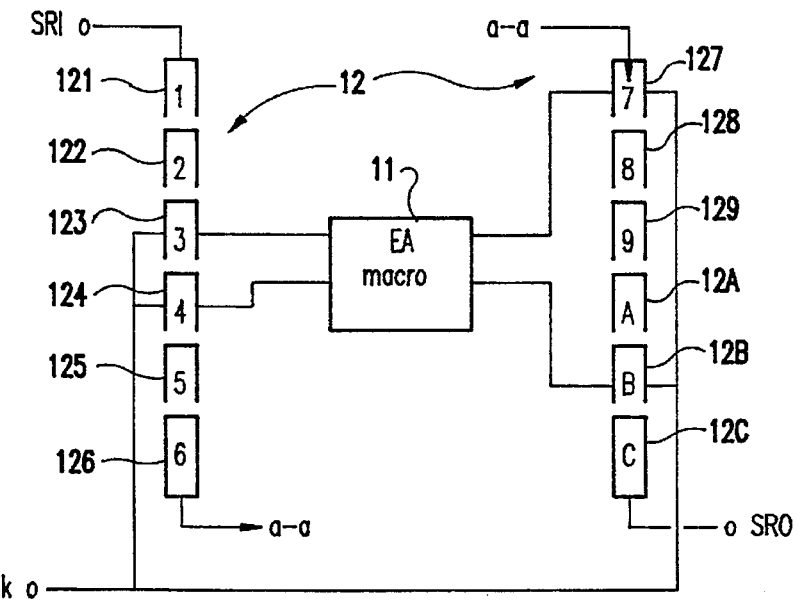
FIG. 1 is a block diagram of an embedded array macro with the addition of a B' clock according to the invention.

Referring now to the drawings, and more particularly to FIG. 1, there is shown an embedded array (EA) macro structure 11 with shift register (SR) latches 12 used in testing the EA macro structure 11. More particularly, SR 12 is shown as comprising latches 121 to 12C connected in series. Two of these SR latches comprised of latches 123 and 124 generate the input test signals to the EA macro structure 11, and two other SR latches comprised of latches 127 and 12B receive the output signals from the EA macro structure 11. The first SRL 121 receives scan data in (SDI) input, and the last SRL 12C outputs the scan data out (SDO). The A, B, B', and C clock inputs are not shown in FIG. 1, but these are applied as described above.

Figure 2:
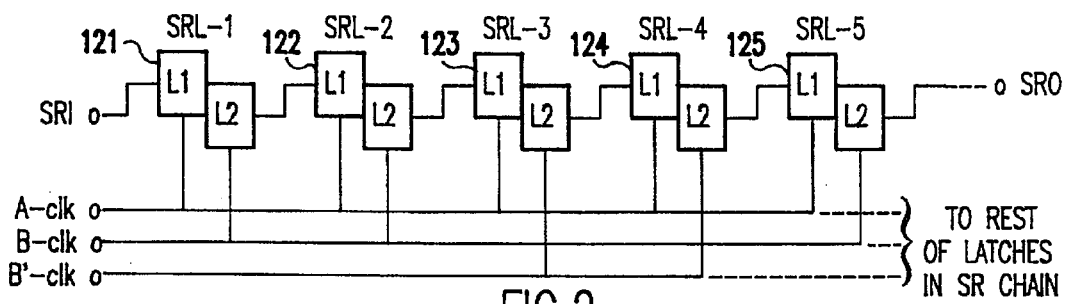
FIG. 2 is a block diagram of a LSSD SRL chain showing in more detail the addition of the B' clock.

FIG. 2 shows in more detail the first five SRLs 12, and as described above, each SRL is composed of two latches, designated as the L1 and L2 latches. The output of the L1 latch is applied as the input to the L2 latch of an SRL, and in the string of latches, the output of an L2 latch is input to a following L1 latch until the final output by the L2 latch of the final SRL. The A clock is applied to each of the L1 latches. In the conventional LSSD technique, the B clock is applied to each of the L2 latches not associated with the array macro structure, while the B' clock is applied to L2 latches associated with the array macro.

Returning to FIG. 1, the LSSD loading sequence is modified by assigning a separate B' clock to certain ones of the SRLs. The original B clock is maintained for the rest of the SRs. This B' clock is similar in all respects to the normal B clock used during the load and unload operations of the SRLs except that it is slightly delayed in time. Also, prior to unloading the shift register, the B' clock is needed to shift the L1 data into the L2 latch prior to unloading the shift register as in the normal unload sequence. In the example shown in FIG. 1, only the L2 latches for SRLs 123, 124, 127, and 12A are clocked by the B' clock. All other A and B clocks are normally distributed. As shown in more detail in FIG. 2, the B' clock is applied to the L2 latches 123 and 124.

Once the B' clock has been established, the sequence for loading and unloading the EA latches (i.e., those associated with the macro structure) can be achieved by "flushing" through the non-EA latches sub-strings and then loading each associated EA latch with a scan cycle. The non-EA latch flush can be realized by simultaneously pulsing the A clock and the B clock, while each EA latch scan cycle can be realized by pulsing the B' clock after the sub-string partial flush operation.

Figure 3:
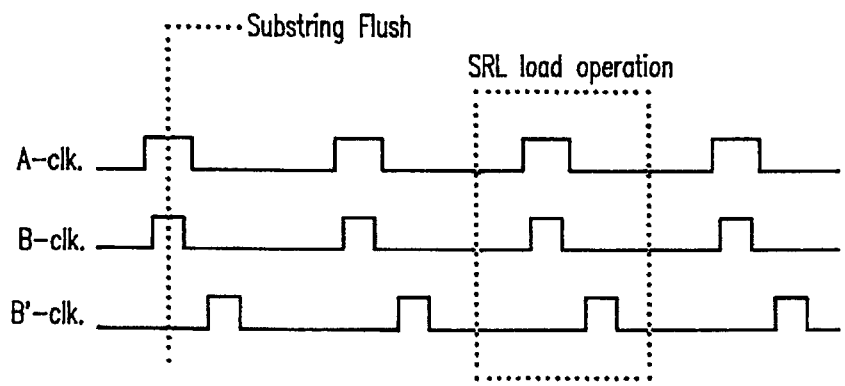
FIG. 3 is a timing diagram showing the fast flush load clocking sequence according to the invention.

FIG. 3 shows the timing diagram showing the A, B and B' clocks. Note that during the partial SR load operation, the A and B clocks must be active long enough for the signal to "flush" through the longest sub-string in the SR chain. This implies that the tester controls the pulse widths of these scan clocks. Therefore, the A and B clocks must not be chopped internally to the device under test, which is normally the case in LSSD testing.

Also note that the normal flush and scan modes required for LSSD testing of the logic in a full shift register string mode is not affected since one can always pulse or stimulate the B and B' clocks simultaneously. Similarly, multiple SR string designs or concurrent shift register loading and unloading operation modes are also unaffected.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of reducing a total propagation length of shift register latches in scan design testing, for testing macro structures embedded within very large logic structures, comprising the steps of:

providing a plurality of shift register latches connected in a chain, each shift register latch including an L1 and an L2 latch which, in response to clock signal input to a first and a second clock input, respectively, shift data into and out of the shift register latch;

selecting first specific shift register latches in the chain of shift register latches for latching and inputting test data inputs to an embedded macro structure;

selecting second specific shift register latches in the chain of shift register latches for receiving test data outputs from the embedded macro structure;

connecting a B' clock to the second clock input of the L2 latches of the first and second specific shift register latches while connecting a B clock to the second clock input of the L2 latches for other shift register latches in the chain; and loading data into the embedded macro structure from the L2 latches of the first specific shift register latches and loading data into the L1 latches of the second specific shift register latches from the embedded macro structure by pulsing a signal on the B' clock to produce a scan cycle for the embedded macro structure.

2. The method recited in claim 1 further comprising the step of flushing the chain of shift register latches by simultaneously pulsing a signal on the first and second clocks of each shift register latch.

3. A scan design test structure of testing a logic macro embedded within a large logic structures comprising:

a plurality of shift register latches, each of said plurality of shift register latches including an L1 latch having:
  a system data input terminal,
  a scan data input terminal,
  an L1 data output terminal,
  a first clock input terminal,
  a second clock input terminal,
  means for shifting a signal on the scan data input terminal to the L1 data output terminal in response to a clock signal input to the first clock input terminal; and
  means for shifting a signal on the system data input terminal to the L1 data output terminal in response to a clock signal input to the second clock input terminal;

an L2 latch having
  a scan data output terminal,
  means for receiving a signal from said L1 data output terminal,
  a clock input terminal, and
  means for shifting said L1 data output signal to said scan data output terminal in response to a signal on said clock input;
  means for receiving a first scan clock and for supplying said first scan clock to the first scan clock input terminal of each of said plurality of shift register latches;

means for receiving a second scan clock and for supplying said received second scan clock to the second scan clock input terminal of each of a sub-plurality of said plurality of shift register latches;

means for receiving a third scan clock and for supplying said received third scan clock to the second scan clock input terminal of the remaining of said plurality of shift register latches;

means for transmitting the system data output of at least one of said sub-plurality of shift register latches to an input of a logic macro to be tested;

means for transmitting a data from an output of a logic macro to the system data input of at least one other of said sub-plurality of shift register latches;

means for inputting a scan data input signal to the scan data input of a first shift register latch of said plurality of plurality of shift register latches, wherein
  the scan data input of each of the remaining shift register latches of said plurality of shift register latches is connected to the scan data output of an adjacent other one of said plurality of shift register latches, such that said plurality of shift register latches are arranged as a shift register chain.

4. A scan test structure according to claim 3 further comprising means for flushing the contents of a sub-plurality of shift register latches of said plurality of shift register latches in response to a concurrent first state of said first and third clock.

5. A scan test structure according to claim 3 further comprising means for flushing the contents of said plurality of shift register latches in response to a concurrent first state of said first, second and third clock.

6. A scan test structure according to claim 4 wherein said means for flushing the contents of a sub-plurality of shift register latches of said plurality of shift register latches comprises means for conducting a signal on the scan data input terminal of each of said plurality of shift register latches to the corresponding scan data output terminal in response to a concurrent first state of a signal input to each said first and second scan clock input terminals.

7. The method recited in claim 1 wherein the B' clock is substantially similar to, but displaced in time, relative to the B clock.

* * * * *